(12) United States Patent
Kimura

(10) Patent No.: US 7,105,797 B2
(45) Date of Patent: Sep. 12, 2006

(54) OPTICAL RECEIVING CIRCUIT

(75) Inventor: Hiroshi Kimura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 758 days.

(21) Appl. No.: 10/370,779

(22) Filed: Feb. 24, 2003

(65) Prior Publication Data

US 2003/0161640 A1 Aug. 28, 2003

(30) Foreign Application Priority Data

Feb. 25, 2002 (JP) ............... 2002-047851

(51) Int. Cl.
*H03F 3/08* (2006.01)
*H03G 3/20* (2006.01)
(52) U.S. Cl. .............. 250/214 A; 250/214 AG
(58) Field of Classification Search ............ 250/214 R, 250/214 AG, 214 A; 330/308; 398/202, 398/208, 209, 210, 211
See application file for complete search history.

(56) References Cited

U.S. PATENT DOCUMENTS 3,634,747 A * 1/1972 Loftus ................ 327/103

| | | | |
|---|---|---|---|
| 6,084,478 A | 7/2000 | Mayampurath | |
| 6,342,694 B1* | 1/2002 | Satoh | ................ 250/214 A |
| 6,832,054 B1* | 12/2004 | Kim | ................ 398/202 |

FOREIGN PATENT DOCUMENTS

JP 06-85556 3/1994

* cited by examiner

*Primary Examiner*—Georgia Epps
*Assistant Examiner*—Don Williams
(74) *Attorney, Agent, or Firm*—McDermott Will & Emery LLP

(57) ABSTRACT

The current-voltage converting circuit converts an input current signal into a voltage signal, and the single-differential converting circuit converts the voltage signal into differential signals so as to output the differential signals. The first and second low-pass filters input outputs from the single-differential converting circuit, respectively, and the voltage-current converting circuit converts a difference between the output voltages from the first and second low-pass filters into a current signal. The current-voltage converting circuit inputs a voltage held in the hold capacitor as a control signal and converts the input current signal into a voltage signal using a current-voltage converting gain according to the control signal.

16 Claims, 12 Drawing Sheets

OPTICAL RECEIVING CIRCUIT

BACKGROUND OF THE INVENTION

The present invention relates to an optical receiving circuit for converting an input current signal into a voltage signal in an optical communication system.

In recent years, in order to realize future FTTF (Fiber to The Home), researches in an optical subscriber network system are conducted enthusiastically. In the optical subscriber network system, transmission distance differs according to a difference in distances from each home to each station. For this reason, since attenuation of lights in optical fibers also differs, a current signal output from a photodiode becomes a current signal having various amplitudes including an infinitesimal amplitude signal through a large amplitude signal. Therefore, the optical receiving circuit requires a wide dynamic range characteristic which makes it possible to receive the infinitesimal amplitude signal through the large amplitude signal. In order to receive a signal having more infinitesimal amplitude, it is necessary to set a current-voltage converting gain for converting a current signal into a voltage signal to higher value in the optical receiving circuit. However, when the current-voltage converting gain is set to be higher, if a signal having large amplitude is input, an output voltage is saturated, thereby making normal reception difficult.

From such a background, Japanese Patent Application Laid-Open No. 6-85556 (1994) suggests an optical receiving circuit for changing a current splitting amount according to amplitude of an input signal so as to suppress saturation of an output voltage. Namely, in this optical receiving circuit, as the output voltage becomes larger, the current splitting amount is controlled so as to be larger, thereby suppressing the saturation of the output voltage.

As mentioned above, in the system for controlling the current splitting amount according to the output voltage, since the current splitting amount becomes excessive or insufficient because of characteristic fluctuation due to process scattering of a threshold voltage or temperature change in a transistor for current splitting, pulse width distortion, namely, duty deterioration occurs in the output signal. As a result, a clock extracting circuit connected with a later stage malfunctions, and it is difficult to decode received data normally.

SUMMARY OF THE INVENTION

It is an object of the present invention to provide an optical receiving circuit which is capable of reducing a pulse width distortion generated when a signal having large amplitude is input and widening a dynamic range.

More concretely, in order to solve the above problem, means which is taken by a first aspect of the invention includes: a current-voltage converting circuit for converting an input current signal into a voltage signal so as to output the voltage signal; a single-differential converting circuit for converting the voltage signal from said current-voltage converting circuit into differential signals so as to output the differential signals; a first low-pass filter for inputting one signal output from the single-differential converting circuit; a second low-pass filter for inputting the other signal output from the single-differential converting circuit; a voltage-current converting circuit for converting a difference between the output signal from the first low-pass filter and the output signal from the second low-pass filter into a current signal; and a hold capacitor for receiving the current signal from the voltage-current converting circuit so as to hold the current signal as a voltage, and the current-voltage converting circuit inputs the voltage held in the hold capacitor as a control input signal so as to convert the input current signal into the voltage signal using a current-voltage converting gain according to the control signal.

According to the invention from the first aspect, the pulse width distortion which occurs when a current signal having large amplitude is input is greatly reduced, and a dynamic range can be widened.

In addition, means which is taken by a second aspect of the invention includes: a current-voltage converting circuit for converting an input current signal into a voltage signal so as to output the voltage signal; a single-differential converting circuit for converting the voltage signal from the current-voltage converting circuit into differential signals so as to output the differential signals; a low-pass filter for inputting one signal output from the single-differential converting circuit; a reference voltage generating circuit for outputting a voltage signal which has a center level of the amplitudes of the output signals from the single-differential converting circuit; a voltage-current converting circuit for converting a difference between the output signal from the low-pass filter and the voltage signal from the reference voltage generating circuit into a current signal; and a hold capacitor for receiving the current signal from the voltage-current converting circuit so as to hold the current signal as a voltage, and the current-voltage converting circuit inputs the voltage held in the hold capacitor as a control signal so as to convert the input current signal into the voltage signal using a current-voltage converting gain according to the control signal.

According to the invention from the second aspect, the pulse width distortion which occurs when a current signal having large amplitude is input can be greatly reduced and the dynamic range can be widened on smaller area.

Further, from a third aspect of the invention, it is preferable that the optical receiving circuit depending on the first or second aspect further includes bias control means for monitoring an amplitude of the voltage signal from the current-voltage converting circuit and controlling the operating current for the voltage-current converting circuit according to the amplitude.

In addition, means which is taken by a fourth aspect of the invention includes: a current-voltage converting circuit for converting an input current signal into a voltage signal so as to output the voltage signal; a single-differential converting circuit for converting the voltage signal from the current-voltage converting circuit into differential signals so as to output the differential signals; a level converting circuit for converting the signal output from the single-differential converting circuit into a digital signal; and a charge pump circuit for generating a current signal according to a logic level of the digital signal converted by the level converting circuit so as to charge or discharge a capacitor, and the current-voltage converting circuit inputs the voltage held in the a capacitor as a control signal and converting the input current signal into the voltage signal using a current-voltage converting gain according to the control signal.

According to the invention from the fourth aspect, the pulse width distortion which occurs when a current signal having large amplitude is input can be greatly reduced and the dynamic range can be widened with simple configuration.

Further, from a fifth aspect of the invention, it is preferable that the optical receiving circuit depending on the fourth aspect further includes a low-pass filter for inputting the control signal from the charge pump circuit, and the current-voltage converting circuit inputs the control signal which has passed through said low-pass filter and converts the input current signal into a voltage signal using the current-voltage converting gain according to the control signal.

In addition, according to a sixth aspect of the invention it is preferable that the optical receiving circuit depending on the fourth or fifth aspect further includes bias control means for monitoring an amplitude of the voltage signal from the current-voltage converting circuit and controlling the operating current for the charge pump circuit according to the amplitude.

Further, means which is taken by a seventh aspect of the invention includes: a current-voltage converting circuit for converting an input current signal into a voltage signal so as to output the voltage signal; a low-pass filter for inputting the voltage signal from the current-voltage converting circuit; a maximum value detecting/holding circuit for inputting the voltage signal from the current-voltage converting circuit so as to detect and hold a maximum voltage value of the voltage signal; a minimum value detecting/holding circuit for inputting the voltage signal from the current-voltage converting circuit so as to detect and hold a minimum voltage value of the voltage signal; a voltage dividing circuit for outputting an intermediate value voltage signal showing an intermediate voltage value between a maximum value voltage signal and a minimum value voltage signal based on the maximum value voltage signal showing the maximum voltage value held by the maximum value detecting/holding circuit and the minimum value voltage signal showing the minimum voltage value held by the minimum value detecting/holding circuit; a voltage-current converting circuit for converting a difference between the voltage signal output from the low-pass filter and the intermediate value voltage signal output from the voltage dividing circuit into a current signal; and a hold capacitor for receiving the current signal from the voltage-current converting circuit so as to hold it as a voltage, and the current-voltage converting circuit inputs the voltage held in the hold capacitor as a control signal and converts the input current signal into the voltage signal using a current-voltage converting gain according to the control signal.

According to the invention from the seventh aspect, the pulse width distortion which occurs when a current signal having large amplitude is input can be greatly reduced and the dynamic range can be widened without providing the single-differential converting circuit.

In addition, from an eighth aspect of the invention, it is preferable that the optical receiving signal depending on the seventh aspect further includes bias control means for monitoring an amplitude of the voltage signal from the current-voltage converting circuit and controlling the operating current for the voltage-current converting circuit, the maximum value detecting/holding circuit and the minimum value detecting/holding circuit according to the amplitude.

Further, from a ninth aspect of the invention, it is preferable that in the optical receiving circuit depending on the first, second, fourth or seventh aspect, the current-voltage converting circuit includes: an inverting amplifier for inputting the input current signal; and a current-voltage converting element which is connected with the inverting amplifier in parallel between input and output terminals of the inverting amplifier.

In addition, from a tenth aspect of the invention, it is preferable that in the optical receiving circuit depending on the ninth aspect, the inverting amplifier includes one or a plurality of inverting amplification circuit(s) cascade-connected with each other, and the optical receiving circuit further includes a first transistor in which its drain is connected with an input terminal of a first inverting amplification circuit of the inverting amplification circuits which inputs the input current signal, and its source is connected with an output terminal of the first inverting amplification circuit, and its gate receives the control signal.

Further, from an eleventh aspect of the invention, it is preferable that the optical receiving circuit depending on the ninth or tenth aspect further includes a second transistor in which its drain is connected with the input terminal of the inverting amplifier, and its source is connected with the output terminal of the inverting amplifier and its gate receives the control signal.

Further, from a twelfth aspect of the invention, it is preferable that the optical receiving circuit depending on the tenth aspect further includes a third transistor connected with the first transistor in parallel in which its drain is connected with an input terminal of the first inverting amplification circuit, its source is connected with an output terminal of the first inverting amplification circuit and its gate receives a signal obtained by shifting a level of the control signal.

In addition, from a thirteenth aspect of the invention, it is preferable that the optical receiving circuit depending on the tenth aspect further includes a uni-directional conductive element connected between the output terminal of the first inverting amplification circuit and the source of the first transistor in series.

Further, from a fourteenth aspect of the invention, it is preferable that in the optical receiving circuit depending on the first, second or fourth aspect, the single-differential converting circuit includes: a low-pass filter for inputting the voltage signal from the current-voltage converting circuit; and a differential amplifier for inputting an output signal from the low-pass filter and the voltage signal from the current-voltage converting circuit and converting them into the differential signals so as to output the differential signals.

In addition, from a fifteenth aspect of the invention, it is preferable that in the optical receiving circuit depending on the fourteenth aspect, the differential amplifier converts the output signal and the voltage signal into the differential signals with limited amplitude.

Further, from a sixteenth aspect of the invention, it is preferable that in the optical receiving circuit depending on the first or second aspect, the low-pass filter includes: a buffer circuit for inputting signals output from the single-differential converting circuit; a resistor for inputting an output from the buffer circuit; and a capacitor which is connected between an output terminal and a ground.

DETAILED DESCRIPTION OF THE INVENTION

Figure 1:
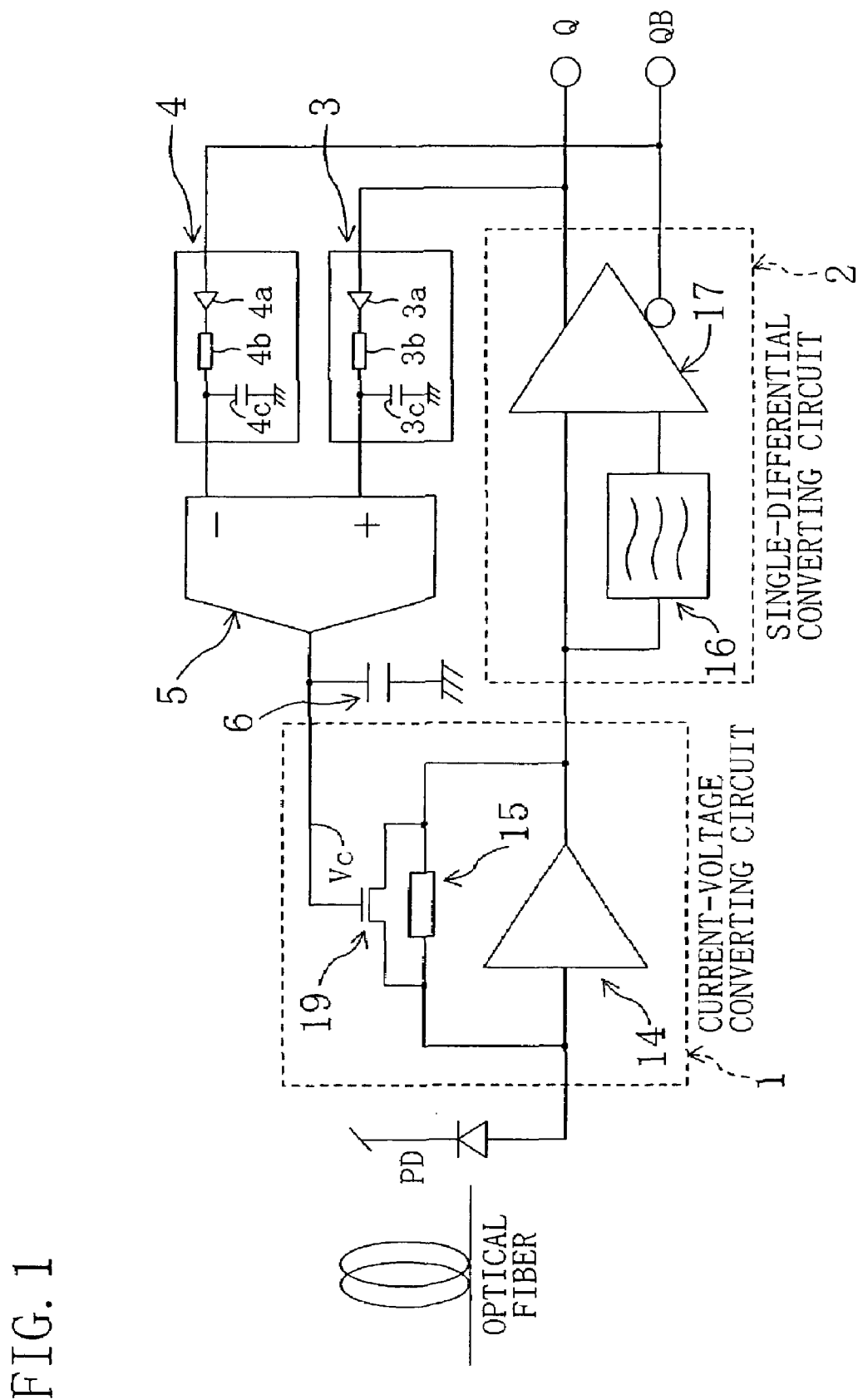
FIG. 1 is a diagram showing a configuration of an optical receiving circuit according to a first embodiment.

Hereinafter, preferred embodiments of the present invention will be described with reference to the accompanying drawings. Here, the same reference numerals denote the same components in the drawings which are referred to in the embodiments, and explanation thereof will not be repeated.

EMBODIMENT 1

FIG. 1 is a block diagram showing a configuration example of an optical receiving circuit according to a first embodiment.

The optical receiving circuit shown in FIG. 1 includes a current-voltage converting circuit 1, a single-differential converting circuit 2, low-pass filters 3 and 4, a voltage-current converting circuit 5, and a hold capacitor 6.

The current-voltage converting circuit 1 has an inverting amplifier 14 and a current-voltage converting element 15 which is connected with the inverting amplifier 14 in parallel, and a transistor 19 is connected between input and output terminals of the inverting amplifier 14. Moreover, the current-voltage converting circuit 1 inputs a current signal obtained by converting a light signal from an optical fiber using a photodiode PD, and converts the current signal into a voltage signal.

The single-differential converting circuit 2 has a low-pass filter 16 and a differential amplifier 17. Moreover, the single-differential converting circuit 2 inputs the voltage signal from the current-voltage converting circuit 1 and outputs complementary output signals Q and QB.

The low-pass filter 3 has a buffer circuit 3a and a resistor 3b and a capacitor 3c. Moreover, the low-pass filter 3 inputs the complementary output signal Q which is one of the complementary outputs from the single-differential converting circuit 2. Similarly the low-pass filter 4 has a buffer circuit 4a, a resistor 4b and a capacitor 4c. Moreover, the low-pass filter 4 inputs the complementary output signal QB which is the other one of the complementary outputs from the single-differential converting circuit 2.

The voltage-current converting circuit 5 inputs the output signals from the low-pass filters 3 and 4 into its two input terminals, and outputs a current signal according to a difference voltage of the two output signals. Namely, when the voltages of the two input terminals are V1 and V2, a current Iout to be output is expressed by (Formula 1).

$$Iout = Gm(V1-V2) \quad \text{(Formula 1)}$$

Here, Gm is a voltage-current converting gain in the case of conversion from a voltage into an electric current.

The hold capacitor 6 inputs the current signal output from the voltage-current converting circuit 5, and converts the current signal into a voltage signal so as to hold the voltage. The voltage (control voltage) held in the hold capacitor 6 is given as a control signal Vc to a gate of the transistor 19 in the current-voltage converting circuit 1.

An operation of the optical receiving circuit having the above configuration will be explained with reference to FIGS. 2A and 2B.

Figure 2A:
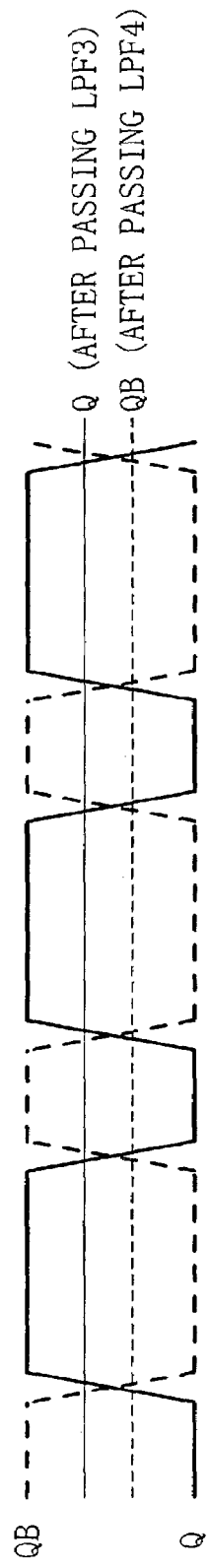
FIGS. 2A and 2B are diagrams for explaining an operation of the optical receiving circuit according to the first embodiment.
Figure 2B:
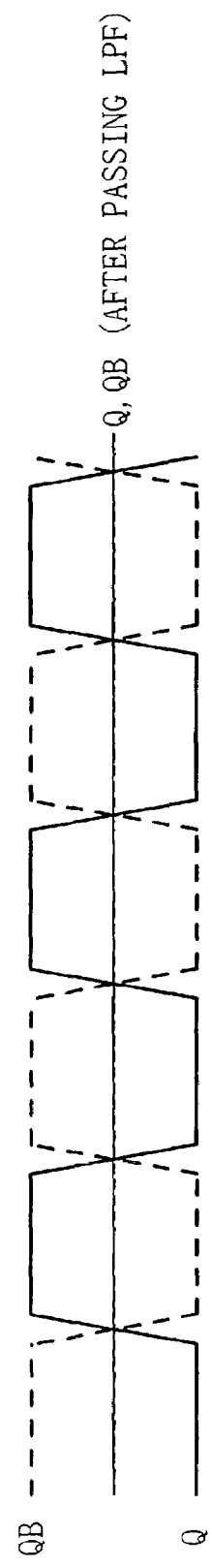

FIGS. 2A and 2B are diagrams for explaining the operation of the optical receiving circuit according to this embodiment.

The voltage signal, which is obtained by converting the current signal from the photodiode PD using the current-voltage converting circuit 1, is input into the single differential converting circuit 2. The complementary output signals Q and QB from the single-differential converting circuit 2 pass through the low-pass filters 3 and 4, respectively, so as to be input into the voltage-current converting circuit 5. The input voltages to be input into the voltage-current converting circuit 5 in such a manner have DC levels of the complementary output signals Q and QB.

There considers the case where a current signal having large amplitude is input into the optical receiving circuit. In this case, the output voltage of the current-voltage converting circuit 1 is saturated and the pulse width is distorted, namely, duty deterioration occurs.

Here as shown in FIG. 2A, it is supposed that one period after the pulse width distortion occurs, namely, the period for which the complementary output signal Q is High is longer than the period for which the complementary output signal QB is high. In this case, the voltage to be output from the low-pass filter 3 becomes higher than the voltage to be output from the low-pass filter 4. Therefore, when the formula 1 is considered, Iout>0, and thus the voltage-current converting circuit 5 allows an electric current according to the difference voltage to flow into the hold capacitor 6 so as to raise the voltage (control voltage). For this reason, since the transistor 19 which inputs the control signal Vc is operated and the current-voltage converting gain of the current-voltage converting circuit 1 becomes small, the saturating period of the output voltage from the current-voltage converting circuit 1 is further reduced, and the period for which the complementary output signal Q is High becomes short.

On the contrary, it is supposed that one period after the pulse width distortion occurs, namely, the period for which the complementary output signal Q is High is shorter than the period for which the complementary output signal QB is High (not shown). In this case, the voltage to be output from the low-pass filter 4 becomes higher than the voltage output from the low-pass filter 3. Therefore, when the formula 1 is considered, Iout<0, and thus the voltage-current converting circuit 5 draws an electric current according to the difference voltage from the capacitor 6 so as to drop the voltage (control voltage). For this reason, since the transistor 19 which inputs the control signal Vc is operated and the current-voltage converting gain of the current-voltage converting circuit 1 becomes large, a function for reducing the saturating period of the output voltage of the current-voltage converting circuit 1 is weakened, and the period for which the complementary output signal Q is High becomes long.

According to this embodiment, when the above operation is repeated, the output voltages from the low-pass filters 3 and 4 are finally converged so as to coincide with each other.

At this time, since the periods for which the complementary output signals Q and QB of the single-differential converting circuit 2 are high are equal with each other, as shown in FIG. 2B, the pulse width distortion, namely, duty deterioration is eliminated. Therefore, the pulse width distortion at the time of inputting a current signal having large amplitude is reduced greatly, and the dynamic range can be widened.

EMBODIMENT 2

Figure 3:
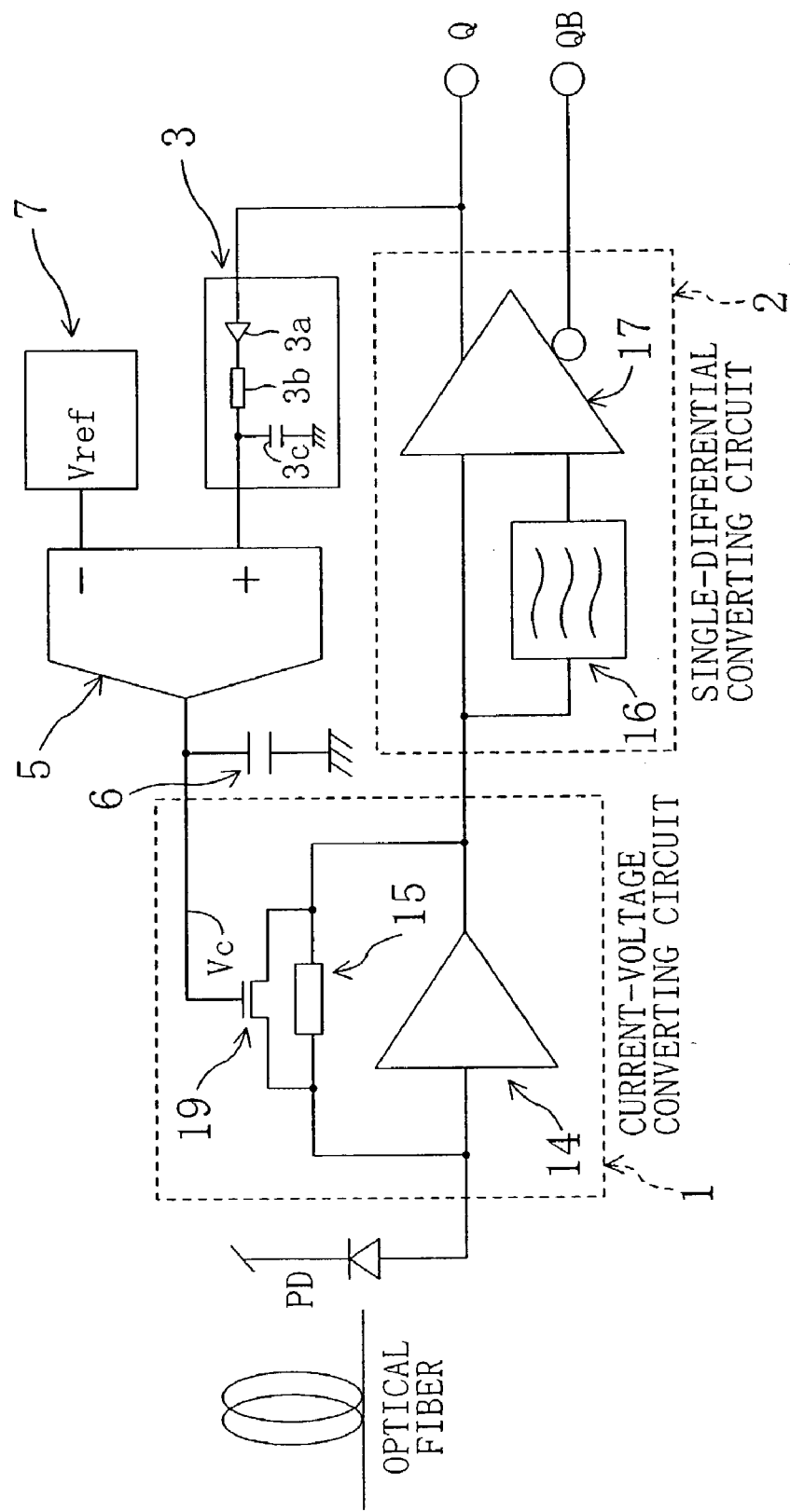
FIG. 3 is a diagram showing a configuration of the optical receiving circuit according to a second embodiment.

FIG. 3 is a block diagram showing a configuration example of the optical receiving circuit according to a second embodiment.

The optical receiving circuit shown if FIG. 3 has a reference voltage generating circuit 7 instead of the low-pass filter 4 in the optical receiving circuit shown in FIG. 1.

The reference voltage generating circuit 7 generates a center voltage of the amplitudes of the complementary output signals Q and QB output from the single-differential converting circuit 2 (namely, DC level when the pulse width distortion is zero) as a reference voltage Vref. The complementary output signal Q from the single-differential converting circuit 2 is input into one input terminal of the voltage-current converting circuit 5, and the reference voltage Vref from the reference voltage generating circuit 7 is input into the other input terminal.

Similarly to the first embodiment, there considers the case where a current signal having large amplitude is input into the optical receiving circuit. In this case, the output voltage from the current-voltage converting circuit 1 is saturated, and the pulse width distortion, namely, the duty deterioration occurs.

Also here, as shown in FIG. 2A, it is supposed that one period after the pulse width distortion occurs, namely, the period for which the complementary output signal Q is High is longer than the period for which the complementary output signal QB is High. In this case, since the voltage output from the low-pass filter 3 becomes higher than the voltage output from the reference voltage generating circuit 7 and Iout>0 according to the formula 1, the voltage-current converting circuit 5 allows an electric current according to a difference voltage to flow into the capacitor 6 so as to raise the voltage (control voltage). For this reason, since the current-voltage converting gain of the current-voltage converting circuit 1 becomes small due to the operation of the transistor 19, the saturating period of the output voltage from the current-voltage converting circuit 1 is further reduced so that the period for which the complementary output signal Q is High becomes short.

On the contrary, it is supposed that one period after the pulse width distortion occurs, namely, the period for which the complementary output signal Q is High is shorter than the period for which the complementary output signal QB is High (not shown). In this case, since the voltage output from the low-pass filter 3 becomes lower than the reference voltage Vref output from the reference voltage generating circuit 7 and Iout<0 according to the formula 1, the voltage-current converting circuit 5 draws the electric current according to the difference voltage so as to drop the voltage (control voltage). For this reason, the current-voltage converting gain of the current-voltage converting circuit 1 becomes large due to the operation of the transistor 19, and thus the function for reducing the saturating period of the output voltage from the current-voltage converting circuit 1 is weakened so that the period for which the complementary output signal Q is High becomes longer.

According to this embodiment, when the above operation is repeated, the voltage output from the low-pass filter 3 and the voltage output from the reference voltage generating circuit 7 are finally converged so as to coincide with each other. At this time, since the periods for which the complementary output signals Q and QB from the single-differential converting circuit 2 are High are equal with each other, as shown in FIG. 2B the pulse width distortion, namely, the duty deterioration is eliminated. Therefore, the pulse width distortion at the time of inputting the current signal having large amplitude is reduced greatly, and the dynamic range can be widened. Moreover, since the optical receiving circuit according to this embodiment has the configuration such that a number of the low-pass filters is less than that in the optical receiving circuit shown in FIG. 1 by one, the same effect can be obtained on a smaller area.

EMBODIMENT 3

Figure 4:
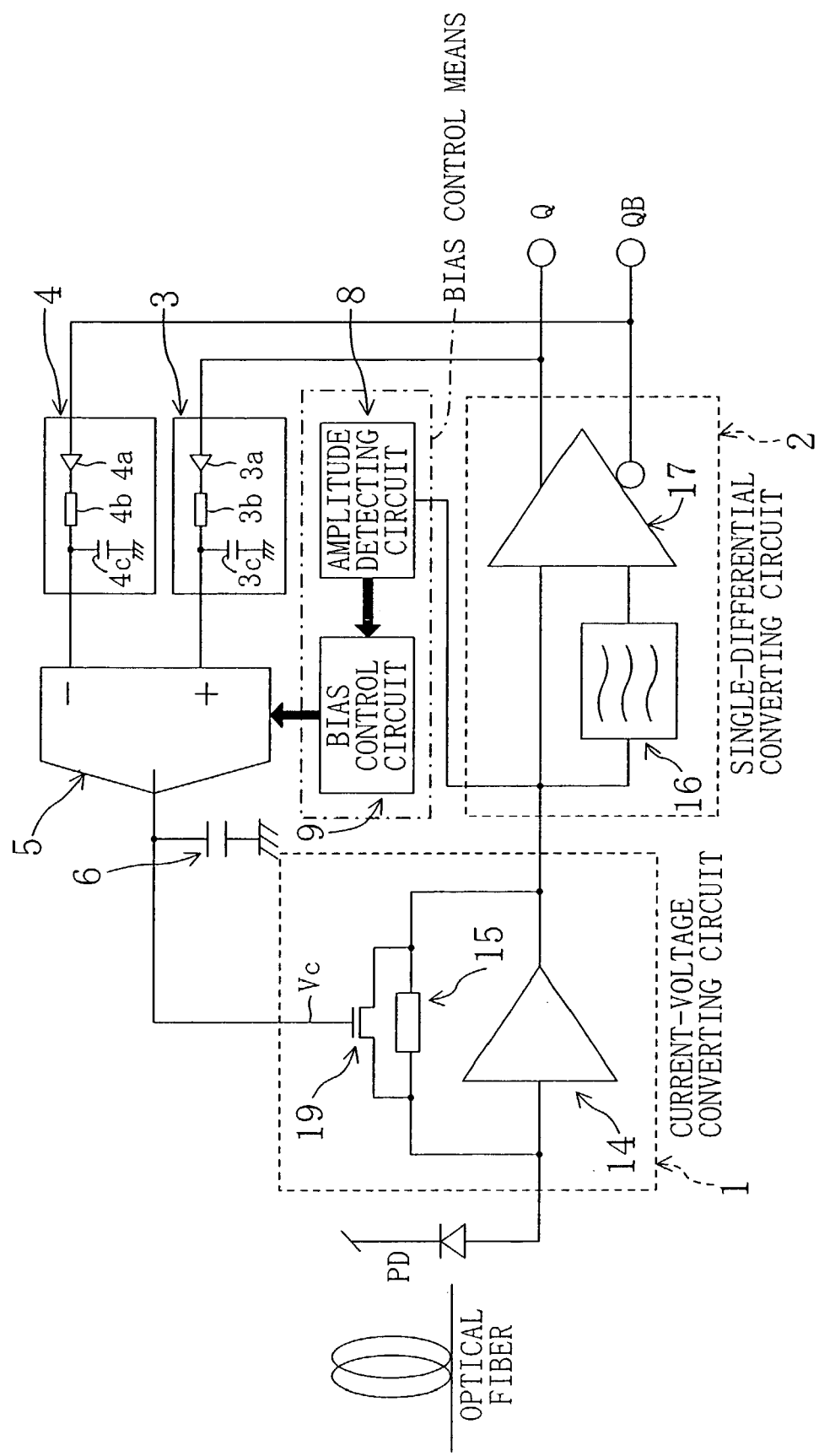
FIG. 4 is a diagram showing a configuration of the optical receiving circuit according to a third embodiment.

FIG. 4 is a block diagram showing a configuration example of the optical receiving circuit according to a third embodiment.

The optical receiving circuit shown in FIG. 4 further includes an amplitude detecting circuit 8 (corresponding to bias control means) and a bias control circuit 9 (corresponding to bias control means) in addition to the components of the optical receiving circuit shown in FIG. 1.

The amplitude detecting circuit 8 inputs the voltage signal output from the current-voltage converting circuit 1 and monitors the amplitude of this signal. Moreover, the bias control circuit 9 outputs a control signal to the voltage-current converting circuit 5 according to the amplitude monitored by the amplitude detecting circuit 8.

The operation of the optical receiving circuit having the above configuration will be explained mainly on the operation based on the new components.

In the optical receiving circuit shown in FIG. 4, the amplitude detecting circuit 8 monitors the amplitude of the voltage signal output from the current-voltage converting circuit 1, and when the amplitude of the voltage signal is smaller than a predetermined amplitude, the bias control circuit 9 outputs a signal which cuts off the operating current for the voltage-current converting circuit 5. Meanwhile, when the amplitude of the voltage signal output from the current-converting circuit 1 is larger than the predetermined amplitude, the bias control circuit 9 outputs a signal which makes the operating current for the voltage-current converting circuit 5 large, and controls a feedback loop which compensates the pulse width distortion so as to close the feedback loop.

According to this embodiment, when the current signal having infinitesimal amplitude in which the compensation of the pulse width distortion is not necessary is input into the current-voltage converting circuit 1, the operating current for the voltage-current converting circuit 5 is cut off. Meanwhile, when the current signal having large amplitude is input, the operating current for the voltage-current converting circuit 5 is increased so that the pulse width distortion compensating function is performed. For this reason, wasteful power consumption can be reduced. At the same time, when the current signal having infinitesimal amplitude is input, the pulse width distortion compensating function is not performed, so that the pulse width distortion compensating function can be prevented from malfunctioning by offset based on mismatching of device which occurs when such a signal is input.

Here, this embodiment described the case where the amplitude detecting circuit 8 and the bias control circuit 9 are provided to the optical receiving circuit shown in FIG. 1. However, this embodiment is not limited to this gist, and even in the case where the amplitude detecting circuit 8 and the bias control circuit 9 are provided similarly to the optical receiving circuit shown in FIG. 2, the present invention can be carried out.

EMBODIMENT 4

Figure 5:
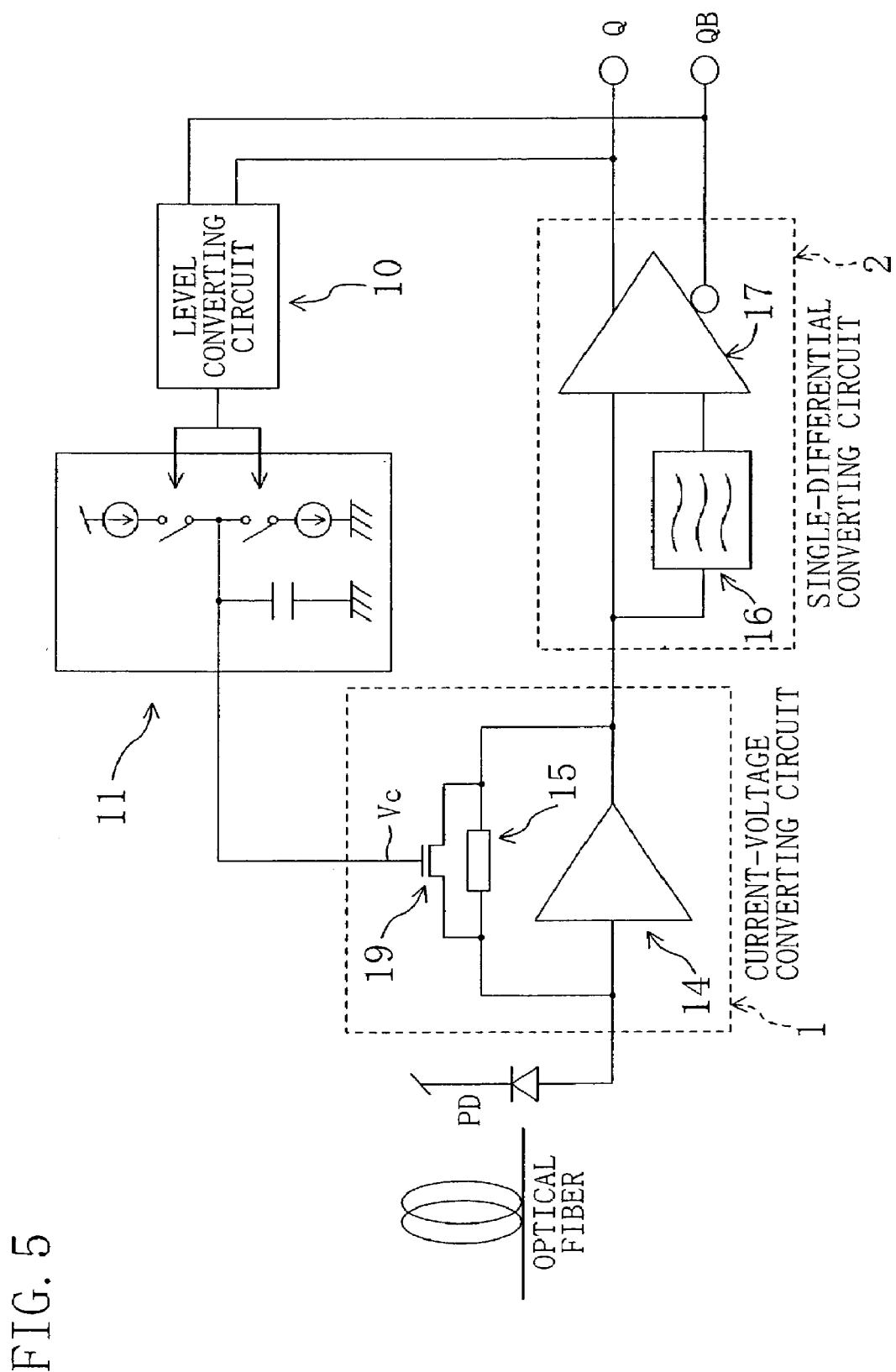
FIG. 5 is a diagram showing a configuration of the optical receiving circuit according to a fourth embodiment.

FIG. 5 is a block diagram showing a configuration example of the optical receiving circuit according to a fourth embodiment.

The optical receiving circuit shown in FIG. 5 includes a level converting circuit 10 and a charge pump circuit 11 in addition to the above-mentioned current-voltage converting circuit 1 and the single-differential converting circuit 2.

The level converting circuit 10 inputs the complementary output signals Q and QB from the single-differential converting circuit 2. The level converting circuit 10 converts the complementary output signals Q and QB having various amplitudes into a digital signal with logic level which amplitudes between power source and ground.

The charge pump circuit 11 inputs the digital signal from the level converting circuit 10 and charges or discharges the capacitor according to the logic level of the digital signal. Thereafter, a voltage output from the charge pump circuit 11, namely, the voltage held in the capacitor is given as a control signal Vc to a gate of the transistor 19 in the current-voltage converting circuit 1.

Here, current values of a constant current source for charge and a constant current source for discharge in the charge pump circuit 11 are equal with each other. Moreover, the digital signal output from the level converting circuit 10 and the complementary output signal Q output from the single-differential converting circuit 2 have the same phase. The charge pump circuit 11 charges the capacitor when the digital signal output from the level converting circuit 10 is High, and discharges the capacitor when the digital signal output from the level converting circuit 10 is Low.

There considers the case where the current signal having large amplitude is input into the optical receiving circuit. In this case, the output voltage of the current-voltage converting circuit 1 is saturated, so that the pulse width distortion, namely, the duty deterioration occurs.

Figure 6:
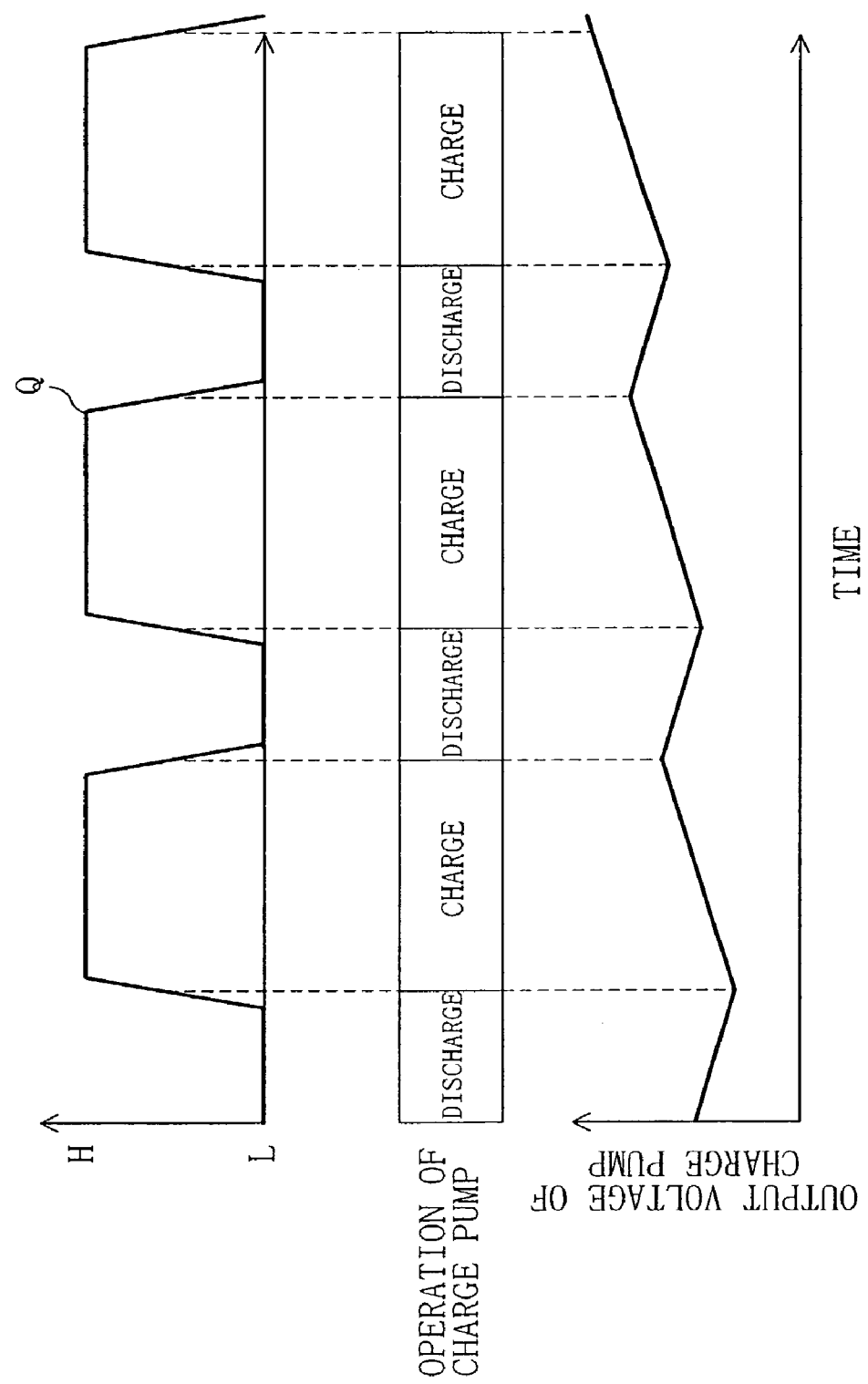
FIG. 6 is a diagram for explaining an operation of the optical receiving circuit according to the fourth embodiment.

FIG. 6 is a diagram for explaining an operation of the charge pump circuit.

Here as shown in FIG. 6, it is supposed that one period after the pulse width distortion occurs, namely, the period for which the complementary output signal Q is High is longer than the period for which the complementary output signal is Low. In this case, since the charging period of the capacitor is longer than the discharging period in the charge pump circuit 11, as shown in FIG. 6 the output voltage (holding voltage of the capacitor) of the charge pump circuit 11, namely, the control voltage gradually rises. For this reason, since the current-voltage converting gain of the current-voltage converting circuit 1 becomes small due to the operation of the transistor 19, the saturating period of the output voltage of the current-voltage converting circuit 1 is further reduced so that the period for which the complementary output signal Q is High becomes short.

On the contrary, it is supposed that one period after the pulse width distortion occurs, namely, the period for which the complementary output signal Q is High becomes shorter than the period of Low (not shown). In this case, since the discharging period of the capacitor is longer than the charging period in the charge pump circuit 11, the output voltage (holding voltage of the capacitor) of the charge pump circuit 11, namely, the control voltage gradually drops (not shown). For this reason, since the transistor 19 which inputs the control signal is operated and the current-voltage converting gain of the current-voltage converting circuit 1 becomes large, the function which reduces the saturating period of the output voltage of the current-voltage converting circuit 1 is weakened, so that the period for which the complementary output signal Q is High becomes long.

According to this embodiment, when the above operation is repeated, the voltage output from the charge pump circuit 11, namely, the control voltage is converged into a voltage such that the period for which the complementary output signal Q is High and the period of Low are equal with each other. For this reason, with this simple structure, the pulse width distortion at the time of inputting the current signal having large amplitude is reduced greatly and the dynamic range can be improved.

Moreover, a modified example of this embodiment will be explained with reference to FIG. 7.

Figure 7:
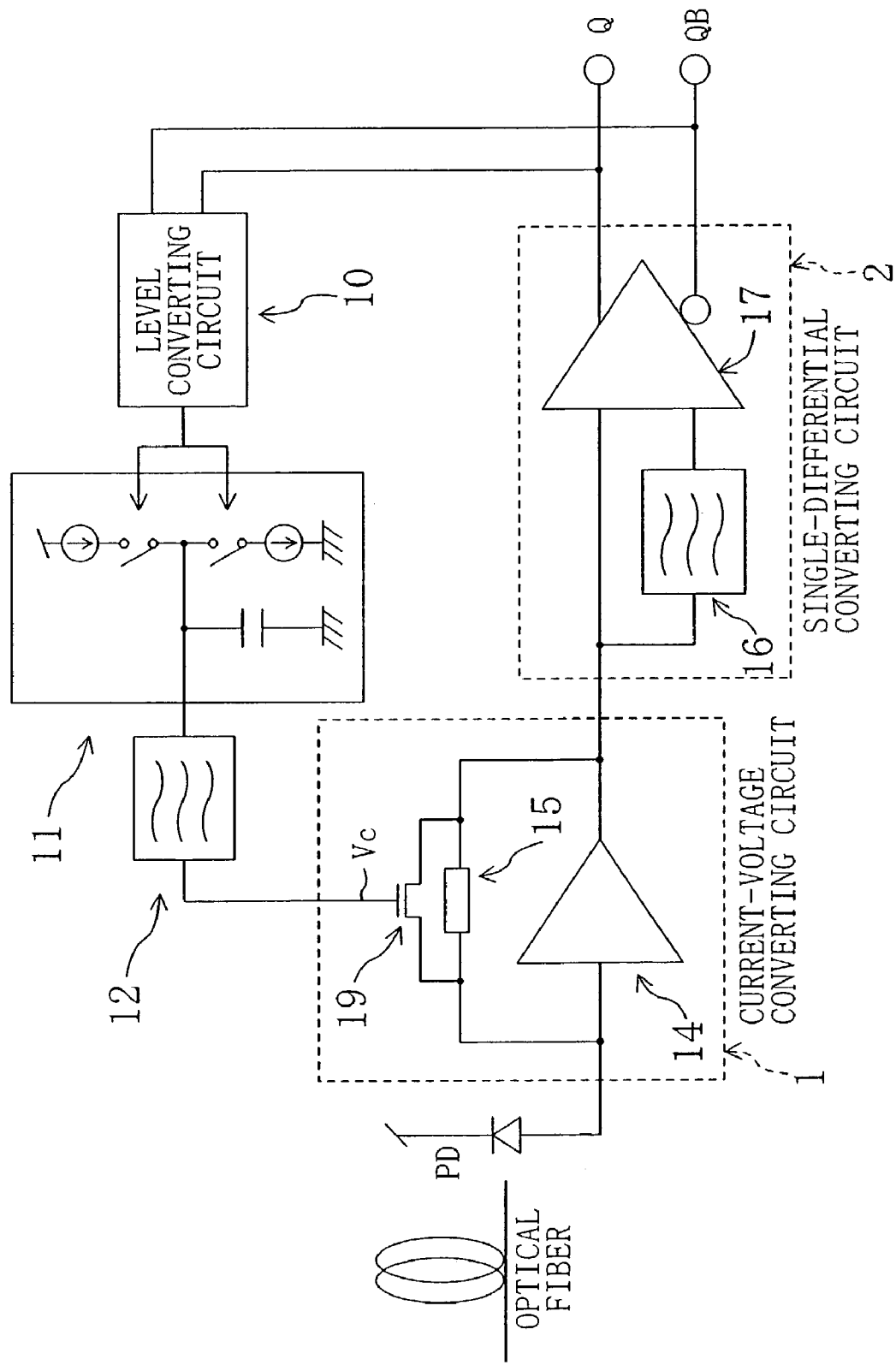
FIG. 7 is a diagram showing another configuration of the optical receiving circuit according to the fourth embodiment.

FIG. 7 is a diagram showing another configuration example of the optical receiving circuit according to this embodiment shown in FIG. 5.

The optical receiving circuit shown in FIG. 7 is constituted by further providing a low-pass filter 12 to the optical receiving circuit shown in FIG. 5.

The low-pass filter 12 is connected between the charge pump circuit 11 and the gate of the transistor 19 in the current-voltage converting circuit 1, and inputs the control signal Vc as the output voltage from the charge pump circuit 11. The transistor 19 in the current-voltage converting circuit 1 inputs the control signal Vc which has passed through this low-pass filter into the gate.

As a result, the control signal Vc from the charge pump circuit 11 passes through the low-pass filter 12 so as to be given to the current-voltage converting circuit 1. For this reason, a high-frequency noise component of the control signal Vc is cut, and the pulse width distortion is reduced greatly by highly precise operation, so that the dynamic range can be widened.

Furthermore, another modified example of this embodiment will be explained with reference to FIG. 8.

Figure 8:
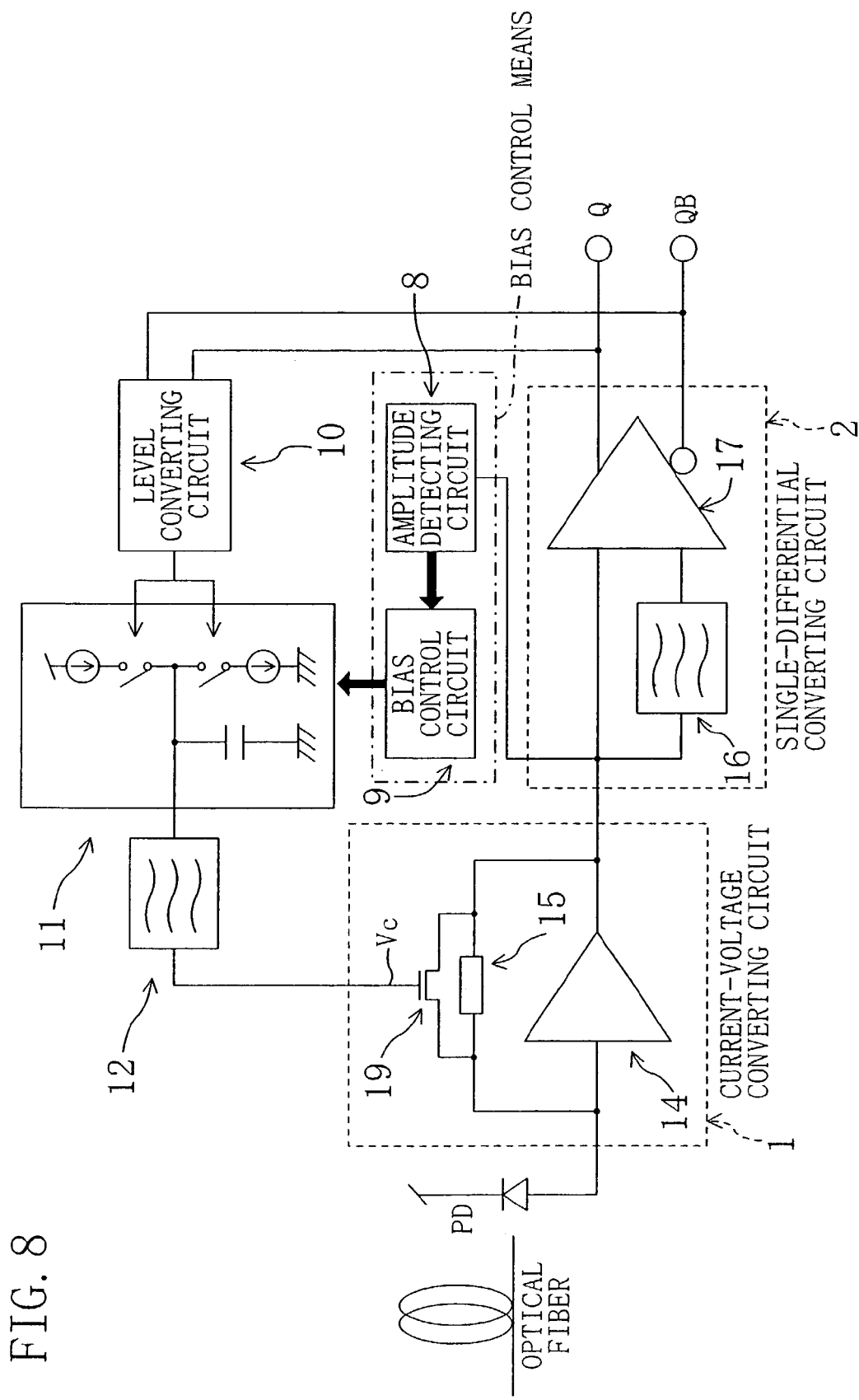
FIG. 8 is a diagram showing another configuration of the optical receiving circuit according to the fourth embodiment.

FIG. 8 is a diagram showing another configuration example of the optical receiving circuit according to this embodiment shown in FIG. 7.

The optical receiving circuit shown in FIG. 8 further includes the amplitude detecting circuit 8 (corresponding to bias control means) and a bias control circuit 9 (corresponding to bias control means) in addition to the elements of the optical receiving circuit shown in FIG. 7.

The amplitude detecting circuit 8 inputs the voltage signal output from the current-voltage converting circuit 1, and monitors the amplitude of this signal. Moreover, the bias control circuit 9 outputs a control signal to the charge pump circuit 11 according to the amplitude monitored by the amplitude detecting circuit 8.

More concretely, in the optical receiving circuit shown in FIG. 8, the amplitude detecting circuit 8 monitors the amplitude of the voltage signal output from the current-voltage converting circuit 1, and when the amplitude of the voltage signal is smaller than a predetermined amplitude, the bias control circuit 9 outputs a signal which cuts off an operating current for the charge pump circuit 11. Meanwhile, when the amplitude of the voltage signal from the current-voltage converting circuit 1 is larger than the predetermined amplitude, the bias control circuit 9 outputs a signal which increases the operating current for the charge pump circuit 11, and controls the feedback loop for compensating the pulse width distortion so as to close the feedback loop.

As a result, when the current signal having infinitesimal amplitude in which it is not necessary to compensate the pulse width distortion is input into the current-voltage converting circuit 1, the operating current for the charge pump circuit 11 is cut off, whereas when the signal having large amplitude is input, the operating current for the charge pump circuit 11 is increased, so that the pulse width distortion compensating function is performed. For this reason, wasteful power consumption can be reduced, and the pulse width distortion compensating function can be prevented from malfunctioning by offset based on mismatching or the like of the device which occurs when the current signal having infinitesimal amplitude is input.

Here, this modified example explained the case where the amplitude detecting circuit 8 and the bias control circuit 9 are provided to the optical receiving circuit shown in FIG. 7. However, this embodiment is not limited to this gist, and even in the case of the configuration where the amplitude detecting circuit 8 and the bias control circuit 9 are provided similarly to the optical receiving circuit shown in FIG. 5, the present invention can be carried out.

EMBODIMENT 5

Figure 9:
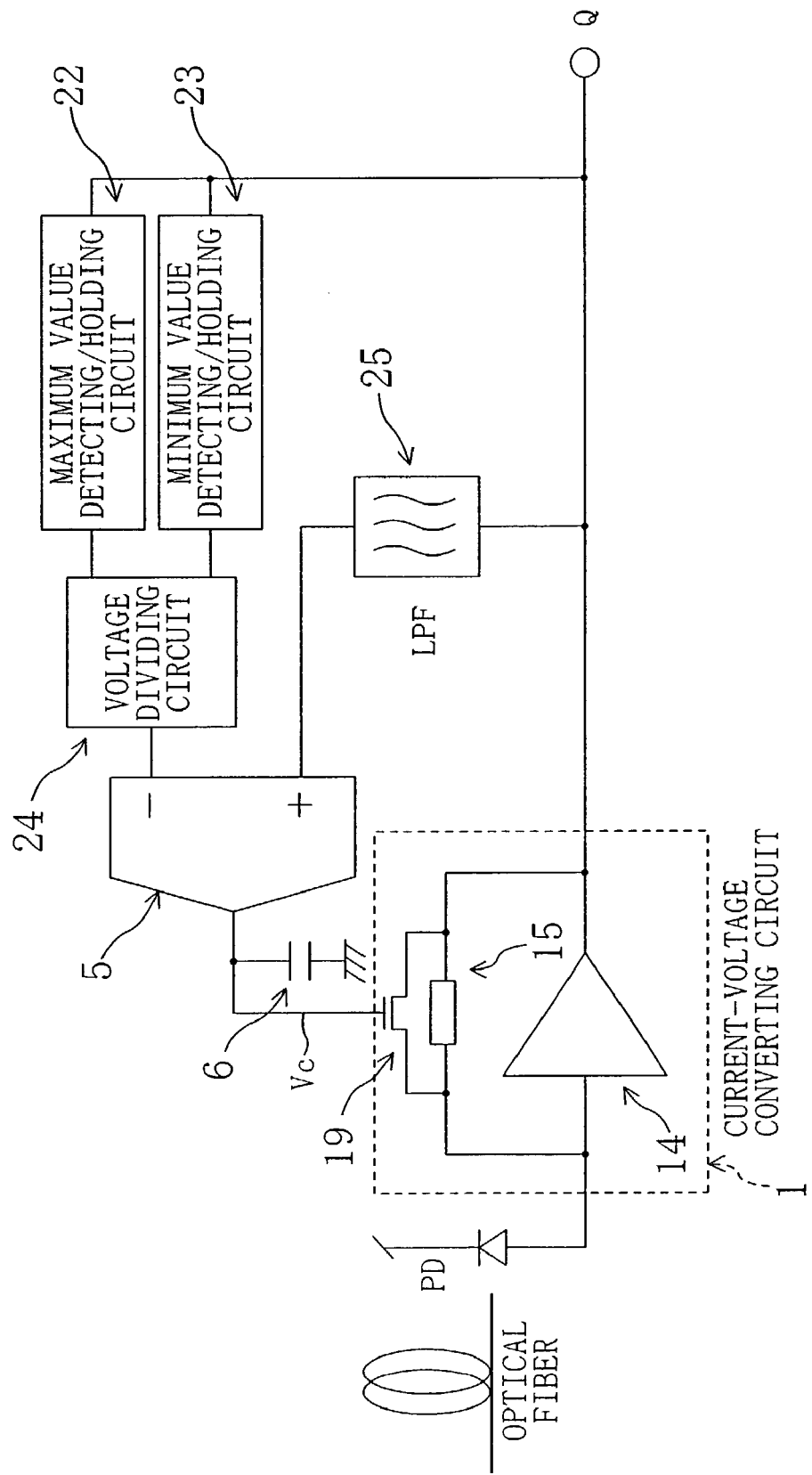
FIG. 9 is a diagram showing a configuration of the optical receiving circuit according to a fifth embodiment.

FIG. 9 is a block diagram showing a configuration example of the optical receiving circuit according to a fifth embodiment.

The optical receiving circuit shown in FIG. 9 includes a maximum value detecting/holding circuit 22, a minimum value detecting/holding circuit 23, a voltage dividing circuit 24 and a low-pass filter 25 as well as the current-voltage converting circuit 1, the voltage-current converting circuit 5 and the hold capacitor 6.

The maximum value detecting/holding circuit 22 inputs a voltage signal output from the current-voltage converting circuit 1, and detects and holds its maximum voltage value. Moreover, the minimum value detecting/holding circuit 23 inputs the voltage signal output from the current-voltage converting circuit 1, and detects and holds its minimum voltage value.

The voltage dividing circuit 24 divides the output voltages of the maximum value detecting/holding circuit 22 and the minimum value detecting/holding circuit 23 and inputs them to one input terminal of the voltage-current converting circuit 5. Moreover, the voltage dividing circuit 24 outputs a voltage having intermediate value of the input voltages input into the input terminals.

The low-pass filter 25 inputs the voltage signal output from the current-voltage converting circuit 1 and removes a high-frequency component, so as to input the voltage to the other input terminal of the voltage-current converting circuit 5.

There considers the case where the current signal having large amplitude is input into the optical receiving circuit having the above configuration. In this case, the output voltage of the current-voltage converting circuit 1 is saturated, and the pulse width distortion, namely, the duty deterioration occurs.

Here as shown in FIG. 2A, it is supposed that the pulse width distortion occurs and the period for which the voltage signal from the current-voltage converting circuit 1 is High is longer than the period of Low. In this case, since the voltage output from the low-pass filter 25 becomes higher than the voltage output from the voltage dividing circuit 24 and Iout >0 according to the formula 1, the voltage-current converting circuit 5 allows the electric current according to the difference voltage to flow into the capacitor 6 so as to raise the voltage (control voltage). For this reason, since the current-voltage converting gain of the current-voltage converting circuit 1 becomes small due to the operation of the transistor 19, the saturating period of the output voltage of the current-voltage converting circuit 1 is further reduced, and the period for which the voltage signal from the current-voltage converting circuit 1 is High becomes short.

On the contrary, it is supposed that the pulse width distortion occurs and the period for which the voltage signal from the current-voltage converting circuit 1 is High is shorter than the period of Low (not shown). In this case, since the voltage output from the low-pass filter 25 becomes lower than the voltage output from the voltage dividing circuit 24 and Iout <0 according to the formula 1, the voltage-current converting circuit 5 draws the electric current according to the difference voltage so as to drop the voltage (control voltage). For this reason, since the transistor 19 which inputs the control signal Vc is operated and the current-voltage converting gain of the current-voltage converting circuit 1 becomes large, the function which reduces the saturating period of the output voltage of the current-voltage converting circuit 1 is weakened, so that the period for which the voltage signal from the current-voltage converting circuit 1 is High becomes long.

According to this embodiment, when the above operation is repeated, the voltage output from the voltage dividing circuit 24 and the voltage output from the low-pass filter 25 are finally converted into the equal voltage. At this time, since the period for which the current signal from the current-voltage converting circuit 1 is High and the period of Low are equal with each other, the pulse width distortion when the current signal having large amplitude is input is reduced greatly, and the dynamic range can be widened.

In addition, a modified example of this embodiment will be explained with reference to FIG. 10.

Figure 10:
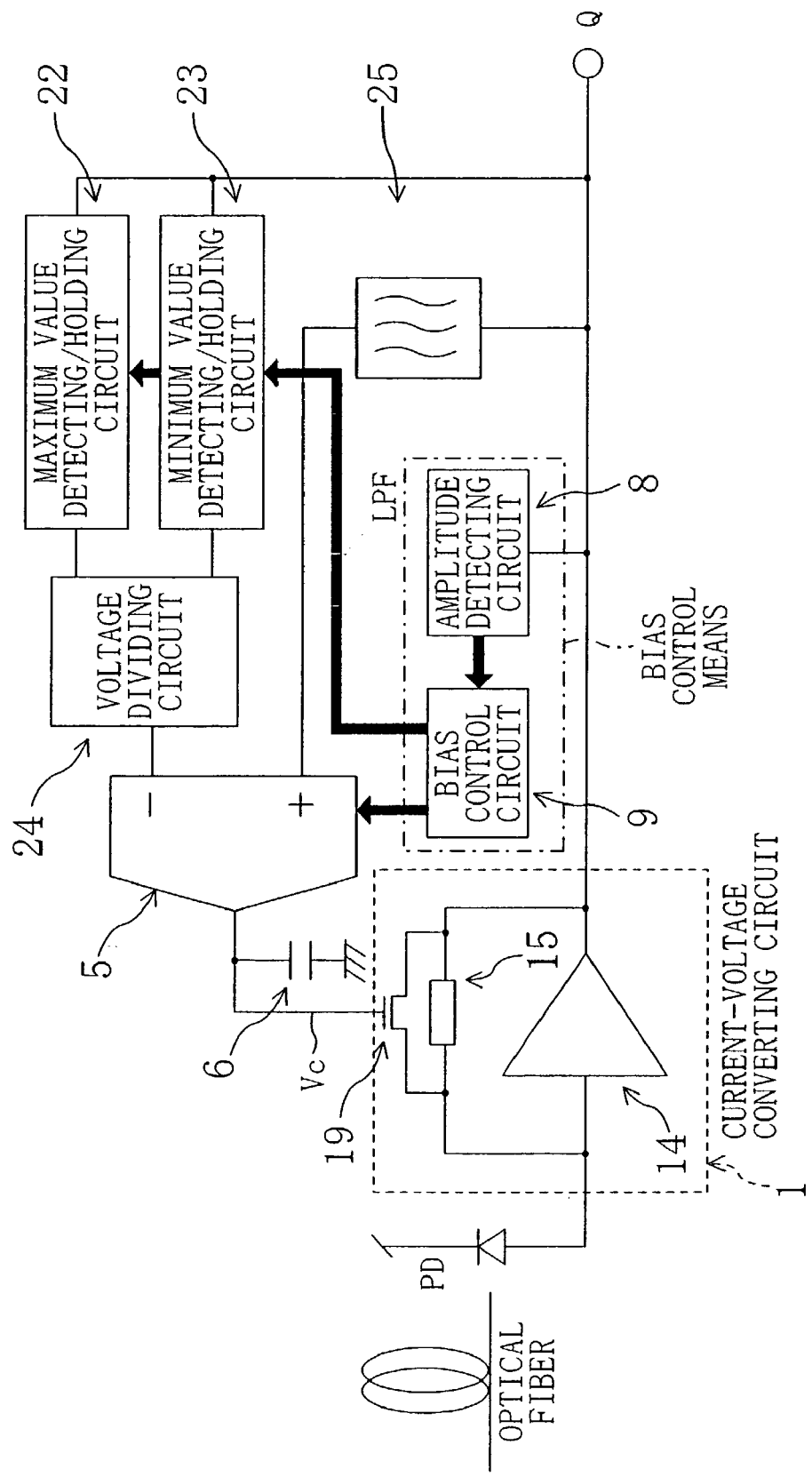
FIG. 10 is a diagram showing another configuration of the optical receiving circuit according to the fifth embodiment.

FIG. 10 is a diagram showing another configuration example of the optical receiving circuit according to the embodiment shown in FIG. 9.

The optical receiving circuit shown in FIG. 10 further includes the amplitude detecting circuit 8 (corresponding to bias control means) and the bias control circuit 9 (corresponding to bias control means) in addition to the components of the optical receiving circuit shown in FIG. 9.

The amplitude detecting circuit 8 inputs a voltage signal output from the current-voltage converting circuit 1 and monitors the amplitude of this signal. Moreover, the bias control circuit 9 outputs a control signal to the voltage-current converting circuit 5 and the maximum value detecting/holding circuit 22 and the minimum value detecting/holding circuit 23 according to the amplitude monitored by the amplitude detecting circuit 8.

More concretely, in the optical receiving circuit shown in FIG. 10, the amplitude detecting circuit 8 monitors the amplitude of the voltage signal output from the current-voltage converting circuit 1, and when the amplitude of the voltage signal is smaller than a predetermined amplitude, the bias control circuit 9 outputs a signal which cuts off the operating current for the voltage-current converting circuit 5, the maximum value detecting/holding circuit 22 and the minimum value detecting/holding circuit 23. Meanwhile, when the amplitude of the voltage signal from the current-voltage converting circuit 1 is larger than the predetermined amplitude, the bias control circuit 9 outputs a signal which increases the operating current for the voltage-current converting circuit 5, the maximum value detecting/holding circuit 22 and the minimum value detecting/holding circuit 23, and controls the feedback loop which compensates the pulse width distortion to close the feedback loop.

As a result, when the current signal having infinitesimal amplitude in which the pulse width distortion does not need to be compensated is input into the current-voltage converting circuit 1, the operating current for the voltage-current converting circuit 5, the maximum value detecting/holding circuit 22 and the minimum value detecting/holding circuit 23 are cut off. Meanwhile, when the current signal having large amplitude is input, the operating current for the voltage-current converting circuit 5 is increased so that the pulse width distortion compensating function is performed. For this reason, wasteful power consumption can be reduced. At the same time, when the current signal having infinitesimal amplitude is input, the pulse width distortion compensating function is not performed, so that the pulse width distortion compensating function can be prevented from malfunctioning by offset based on mismatching or the like of the device which occurs when such a signal is input.

EMBODIMENT 6

Figure 11:
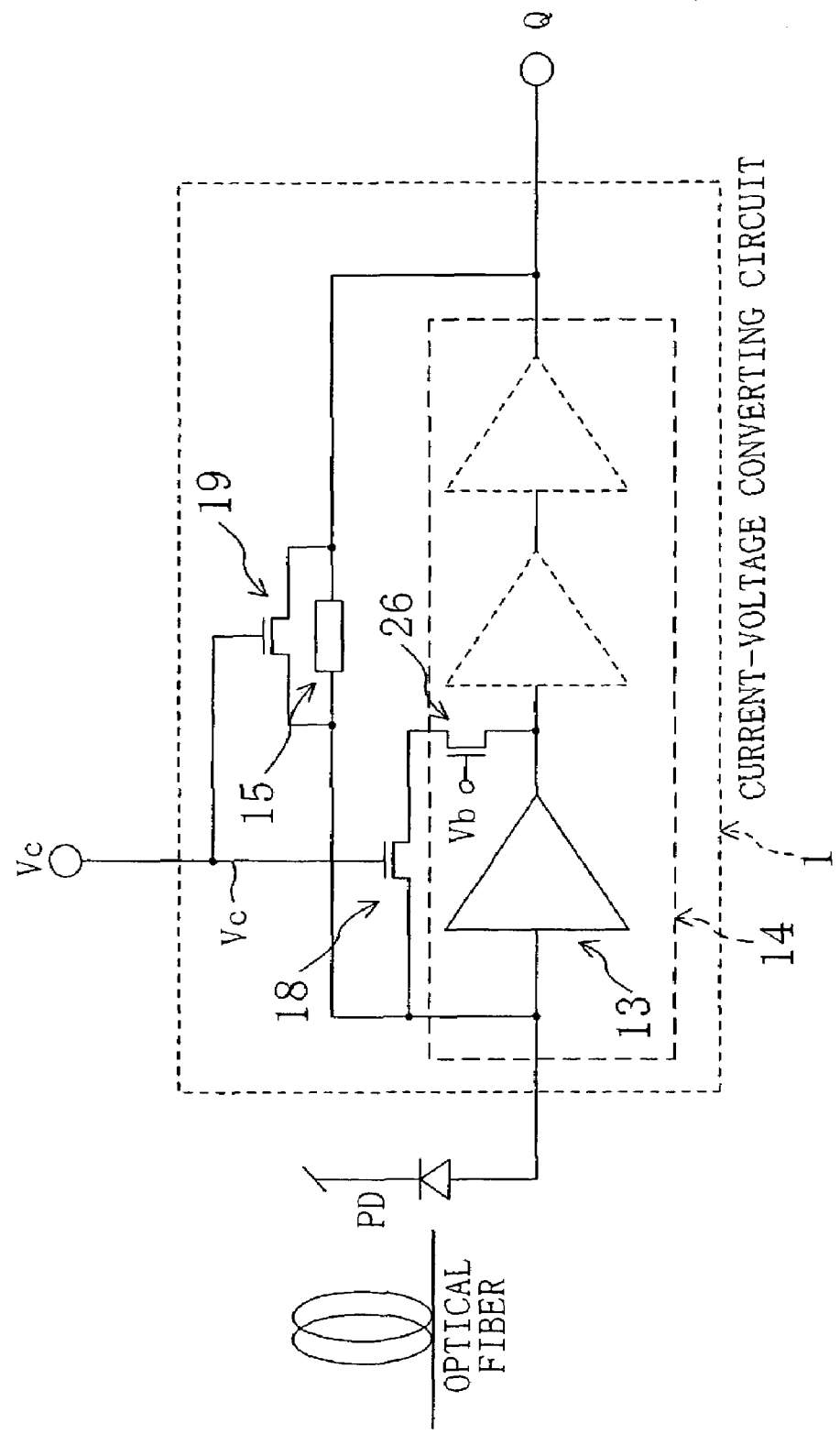
FIG. 11 is a diagram showing a structure of an inverting amplifier according to a sixth embodiment.

FIG. 11 is a diagram showing an internal configuration example of the current-voltage converting circuit 1 in the optical receiving circuit according to a sixth embodiment.

The current-voltage converting circuit 1 shown in FIG. 11 includes a transistor 18 and a transistor 26 as well as the inverting amplifier 14, the current-voltage converting element 15 and the transistor 19.

The inverting amplifier 14 includes an inverting amplification circuit 13 which inputs a current signal from the photodiode PD and is arranged at the first stage, and includes a plurality of amplifying circuits which are cascade-connected with each other.

The transistor 18 is connected between input and output terminals of the inverting amplification circuit 13, and its gate receives the control signal Vc.

The transistor 26 serves as a uni-directional conductive element, and is connected with the transistor 18 in series, and its gate receives a predetermined constant voltage Vb.

With such a configuration, the transistor 18 which receives the control signal Vc is operated so as to bypass an excessive input current, and an entire open circuit gain of the inverting amplifier 14 becomes small. For this reason, the dynamic range can be widened by more stable operation. Moreover, since the transistor 26 is provided for the uni-directional conductive element, reverse flow of the electric current from the output terminal into the input terminal of the inverting amplification circuit 13 can be prevented via the transistor 18, so that the more stable operation can be realized.

In addition, a modified example of this embodiment will be explained with reference to FIG. 12.

Figure 12:
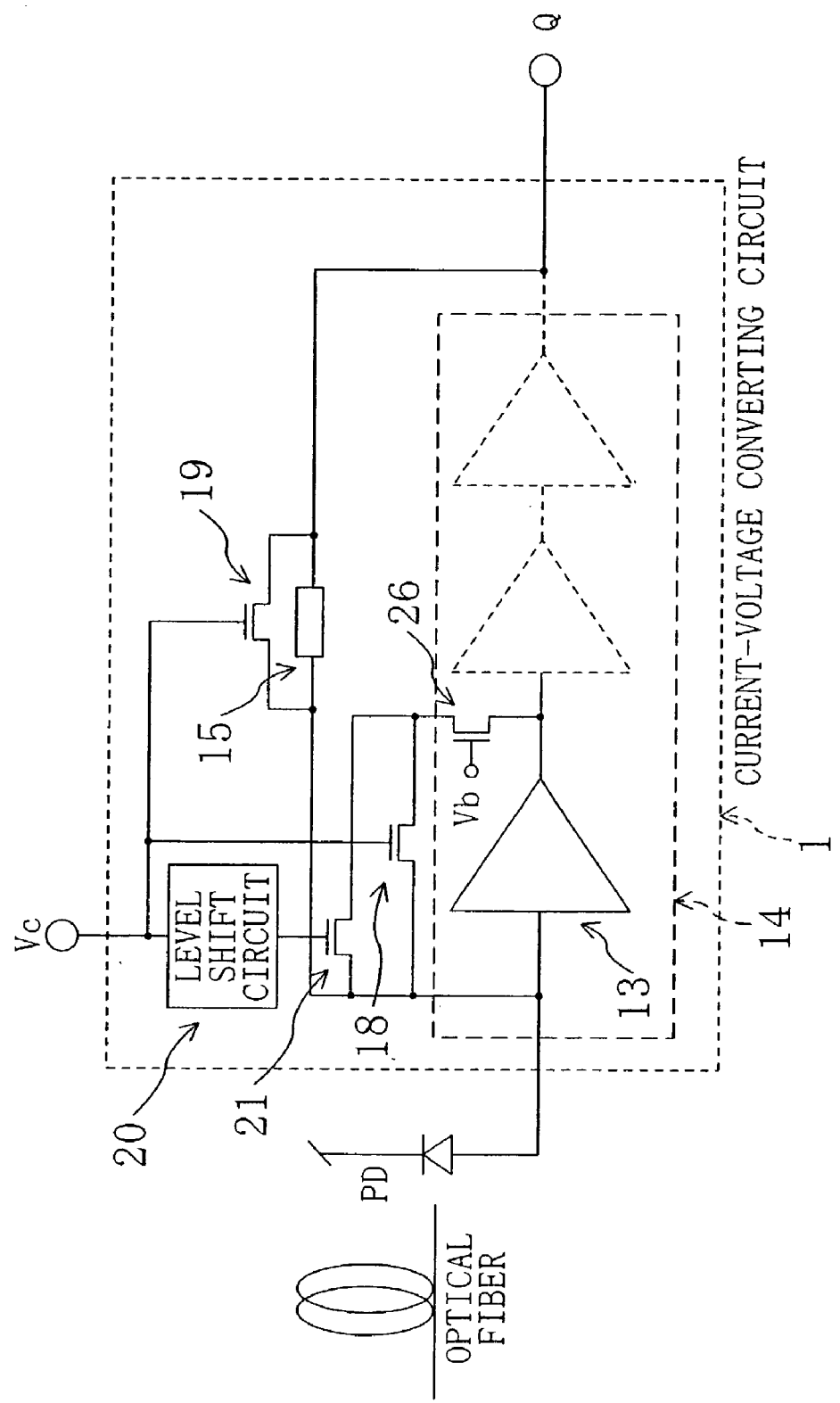
FIG. 12 is a diagram showing another structure of the inverting amplifier according to the sixth embodiment.

FIG. 12 is a diagram showing another configuration example of the current-voltage converting circuit 1.

The current-voltage converting circuit 1 shown in FIG. 12 further includes a level shift circuit 20 and a transistor 21 in addition to the components of the current-voltage converting circuit shown in FIG. 11.

The level shift circuit 20 shifts a level of the control signal Vc so as to output the control signal Vc to the transistor 21. Moreover, the transistor 21 is connected with the transistor 18 in parallel, and its gate receives the control signal Vc whose level is shifted from the level shift circuit 21.

With such a configuration, the transistor 18 which directly receives the control signal Vc and the transistor 21 which receives the control signal Vc whose level is shifted start to operate at different timings. For this reason, since an abrupt change in the current-voltage converting gain can be suppressed, while the stable operation is maintained, the dynamic range can be further widened.

What is claimed is:

1. An optical receiving circuit, comprising:
   a current-voltage converting circuit for converting an input current signal into a voltage signal so as to output the voltage signal;
   a single-differential converting circuit for converting the voltage signal from said current-voltage converting circuit into differential signals so as to output the differential signals;
   a first low-pass filter for inputting one signal output from said single-differential converting circuit;
   a second low-pass filter for inputting the other signal output from said single-differential converting circuit;
   a voltage-current converting circuit for converting a difference between the output signal from said first low-pass filter and the output signal from said second low-pass filter into a current signal; and
   a hold capacitor for receiving the current signal from said voltage-current converting circuit so as to hold the current signal as a voltage,
   wherein said current-voltage converting circuit inputs the voltage held in said hold capacitor as a control signal so as to convert the input current signal into the voltage signal using a current-voltage converting gain according to the control signal.

2. An optical receiving circuit, comprising:
   a current-voltage converting circuit for converting an input current signal into a voltage signal so as to output the voltage signal;
   a single-differential converting circuit for converting the voltage signal from said current-voltage converting circuit into differential signals so as to output the differential signals;
   a low-pass filter for inputting one signal output from said single-differential converting circuit;
   a reference voltage generating circuit for outputting a voltage signal which has a center level of the amplitudes of the signals output from said single-differential converting circuit;
   a voltage-current converting circuit for converting a difference between the output signal from said low-pass filter and the voltage signal from said reference voltage generating circuit into a current signal; and
   a hold capacitor for receiving the current signal from said voltage-current converting circuit so as to hold the current signal as a voltage,
   wherein said current-voltage converting circuit inputs the voltage held in said hold capacitor as a control signal so as to convert the input current signal into the voltage signal using a current-voltage converting gain according to the control signal.

3. The optical receiving circuit according to claim 1 or 2, further comprising bias control means for monitoring an amplitude of the voltage signal from said current-voltage converting circuit and controlling the operating current for said voltage-current converting circuit according to the amplitude.

4. An optical receiving circuit, comprising:
- a current-voltage converting circuit for converting an input current signal into a voltage signal so as to output the voltage signal;
- a single-differential converting circuit for converting the voltage signal from said current-voltage converting circuit into differential signals so as to output the differential signals;
- a level converting circuit for converting the signal output from said single-differential converting circuit into a digital signal; and
- a charge pump circuit for generating a current signal according to a logic level of the digital signal converted by said level converting circuit so as to charge or discharge a capacitor,
- wherein said current-voltage converting circuit inputs the voltage held in said capacitor as a control signal and converting the input current signal into the voltage signal using a current-voltage converting gain according to the control signal.

5. The optical receiving circuit according to claim 4, further comprising:
- a low-pass filter for inputting the control signal from said charge pump circuit,
- wherein said current-voltage converting circuit inputs the control signal which has passed through said low-pass filter and converts the input current signal into a voltage signal using the current-voltage converting gain according to the control signal.

6. The optical receiving circuit according to claim 4 or 5, further comprising bias control means for monitoring an amplitude of the voltage signal from said current-voltage converting circuit and controlling the operating current for said charge pump circuit according to the amplitude.

7. An optical receiving circuit, comprising:
- a current-voltage converting circuit for converting an input current signal into a voltage signal so as to output the voltage signal;
- a low-pass filter for inputting the voltage signal from said current-voltage converting circuit;
- a maximum value detecting/holding circuit for inputting the voltage signal from said current-voltage converting circuit to detect and hold a maximum voltage value of the voltage signal;
- a minimum value detecting/holding circuit for inputting the voltage signal from said current-voltage converting circuit to detect and hold a minimum voltage value of the voltage signal;
- a voltage dividing circuit for outputting an intermediate value voltage signal showing an intermediate voltage value between a maximum value voltage signal and a minimum value voltage signal based on the maximum value voltage signal showing the maximum voltage value held by said maximum value detecting/holding circuit and the minimum value voltage signal showing the minimum voltage value held by said minimum value detecting/holding circuit;
- a voltage-current converting circuit for converting a difference between the voltage signal output from said low-pass filter and the intermediate value voltage signal output from said voltage dividing circuit into a current signal; and
- a hold capacitor for receiving the current signal from said voltage-current converting circuit so as to hold it as a voltage,
- wherein said current-voltage converting circuit inputs the voltage held in said hold capacitor as a control signal and converts the input current signal into the voltage signal using a current-voltage converting gain according to the control signal.

8. The optical receiving circuit according to claim 7, further comprising bias control means for monitoring an amplitude of the voltage signal from said current-voltage converting circuit and controlling the operating current for said voltage-current converting circuit, said maximum value detecting/holding circuit and said minimum value detecting/holding circuit according to the amplitude.

9. The optical receiving circuit according to claim 1, 2, 4 or 7, wherein said current-voltage converting circuit includes:
- an inverting amplifier for inputting the input current signal; and
- a current-voltage converting element which is connected with said inverting amplifier in parallel between input and output terminals of said inverting amplifier.

10. The optical receiving circuit according to claim 9, wherein said inverting amplifier includes one or a plurality of inverting amplification circuit(s) cascade-connected with each other, further comprising a first transistor in which its drain is connected with an input terminal of a first inverting amplification circuit of said inverting amplification circuits which inputs the input current signal, and its source is connected with an output terminal of said first inverting amplification circuit, and its gate receives the control signal.

11. The optical receiving circuit according to claim 9 or 10, further comprising a second transistor in which its drain is connected with the input terminal of said inverting amplifier, and its source is connected with the output terminal of said inverting amplifier and its gate receives the control signal.

12. The optical receiving circuit according to claim 10, further comprising a third transistor connected with said first transistor in parallel in which its drain is connected with an input terminal of said first inverting amplification circuit, its source is connected with an output terminal of said first inverting amplification circuit and its gate receives a signal obtained by shifting a level of the control signal.

13. The optical receiving circuit according to claim 10, further comprising a uni-directional conductive element connected between the output terminal of said first inverting amplification circuit and the source of said first transistor in series.

14. The optical receiving circuit according to claim 1, 2 or 4, wherein said single-differential converting circuit includes:
- a low-pass filter for inputting the voltage signal from said current-voltage converting circuit; and
- a differential amplifier for inputting an output signal from said low-pass filter and the voltage signal from said current-voltage converting circuit and converting them into the differential signals so as to output the differential signals.

15. The optical receiving circuit according to claim 14, wherein said differential amplifier converts the output signal and the voltage signal into the differential signals with limited amplitude.

16. The optical receiving circuit according to claim 1 or 2, wherein said low-pass filter includes:
- a buffer circuit for inputting signals output from said single-differential converting circuit;
- a resistor for inputting an output from said buffer circuit; and
- a capacitor which is connected between an output terminal and a ground.

* * * * *